(12) United States Patent
Liu

(10) Patent No.: US 7,825,691 B2
(45) Date of Patent: Nov. 2, 2010

(54) TRANSMISSION CIRCUIT AND RELATED METHOD

(75) Inventor: Chih-Min Liu, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 1065 days.

(21) Appl. No.: 11/538,060

(22) Filed: Oct. 3, 2006

(65) Prior Publication Data

US 2007/0152749 A1 Jul. 5, 2007

(30) Foreign Application Priority Data

Dec. 15, 2005 (TW) .............................. 94144512 A

(51) Int. Cl.
*H03K 19/0175* (2006.01)

(52) U.S. Cl. .............................. 326/83; 326/82; 326/86; 327/108

(58) Field of Classification Search ............. 326/26–27, 326/30, 81–83, 86–87, 114–115, 127; 327/108–109, 327/112, 65, 170
See application file for complete search history.

(56) References Cited

U.S. PATENT DOCUMENTS

| | | | |
|---|---|---|---|
| 4,988,902 A | 1/1991 | Dingwall | |
| 6,313,682 B1 | 11/2001 | Muller | |
| 6,615,301 B1 * | 9/2003 | Lee et al. ..................... | 710/106 |
| 6,674,313 B2 | 1/2004 | Kurisu | |
| 6,759,868 B2 | 7/2004 | Helt | |
| 6,781,434 B2 | 8/2004 | Jensen | |
| 6,794,900 B2 | 9/2004 | Tang | |
| 6,870,390 B1 * | 3/2005 | Groen et al. ................... | 326/27 |
| 7,034,574 B1 * | 4/2006 | Li ................................ | 326/83 |
| 7,098,703 B2 * | 8/2006 | Harvey ....................... | 327/111 |
| 7,183,813 B2 * | 2/2007 | Kasanyal et al. .............. | 327/65 |
| 7,202,649 B2 * | 4/2007 | Bird et al. ................... | 323/282 |
| 7,215,156 B1 * | 5/2007 | Li ............................... | 326/115 |
| 2003/0076136 A1 | 4/2003 | McCorkle | |

FOREIGN PATENT DOCUMENTS

TW 200514435 4/2005

\* cited by examiner

*Primary Examiner*—James H. Cho
*Assistant Examiner*—Christopher Lo
(74) *Attorney, Agent, or Firm*—Winston Hsu; Scott Margo; Min-Lee Teng

(57) ABSTRACT

A transmission circuit and related method are disclosed. A transmitter in the transmission circuit has CMOS transistors as driving units for responding an input signal to drive an output signal at an output node, and each driving unit has a corresponding charge unit formed by a capacitor-connected MOS of a same type as that of the corresponding driving unit. Each charge unit is controlled by an auxiliary signal inverse to the input signal. When a level transition occurs in the input signal, the charge unit can compensate charge injection and clock feed-through caused by the driving unit at the output node, and form peaks for pre-emphasis. In this way, a better transmission property can be realized by using a simpler and low-power circuit design.

20 Claims, 11 Drawing Sheets

TRANSMISSION CIRCUIT AND RELATED METHOD

BACKGROUND OF THE INVENTION

1. Field of the Invention

The present invention provides a transmission circuit and related method, and more particularly, a transmitter circuit and related method compensating and emphasizing the quality of the transmission signal with equivalent capacitance effect.

2. Description of the Prior Art

In modern society, every kind of information, such as data, documents, and video files are able to be transformed into electronic signals. How to quickly and correctly transmit electronic signals for information circulation with more efficiency has also become the target of the research and development of modern information companies. For instance, in the electronic systems or network systems, data exchanging between different functions of circuits, devices, and terminals is accomplished by buses or network transmission lines for coordinating the operation, which realizes the entire function of the electronic systems or the network systems. Therefore, raising the efficiency of the signal transmission between circuits, maintaining the quality of the signal transmission, and lowering the power dissipation of the signal transmission contribute to the rise of the entire efficiency and the performance of the system.

Generally, when a transmission circuit in the system transmits signals to a receiving circuit by a connection (bus, network transmission lines), the transmission circuit inputs the ready-for-transmission signals into the transmitter which drives the ready-for-transmission signals (input signals) into output signals transmitted to the receiving circuits. In the prior art, the transmitters are formed of CMOS transistors, and the CMOS transistors conduct or close according to the level of the input signals to push/pull the output signals. Since the CMOS transistor can be an inverter and there is inverse trend between the input/output signals, the inverse trend will cause the charge injection and clock feed-through. The charge injection and clock feed-through form a rising peak wave in the falling-edge of the output signal or a falling peak wave in the rising-edge of the input signal and interfere with the normal level transition of the output signal.

However, as known by those skilled in the art, the natural characteristics of the connection (the connection length and the equivalent output impendence and load of the connection) and the signal itself (the levels of frequency and clock) affect the quality of the signal transmission and the signal distortion of the receiving circuit. For instance, the transmission circuit transmits a signal of a square wave to the receiving circuit, but in fact, the receiving circuit receives the square wave whose rising and falling edges become slack during the transmission, making the original square wave distort into a sawtooth wave so that the recognition of the signal of the receiving circuit is affected.

In the prior art, to improve the bad transmission characteristics, two transmitters and a clock delay circuit are used in the transmission circuit to pre-emphasize the wave of the output signal for emphasizing the amplitudes of signal changes at the rising and the falling edges of the signals in the output signals, thereby reducing the wave distortion during transmission. However, there are disadvantages of the prior art. First, the technique of the prior art uses two transmitters to synthesize one emphasized output signal, which increases power dissipation and layout area used. Second, in the prior art, the emphasized signal is properly synthesized with a clock delay circuit which needs an extra clock to trigger. Furthermore, the transmitter of the prior art is interfered with by some non-ideal factors, e.g. charge injection and clock feed-through. Even by using two transmitters matched with a clock delay circuit to synthesize emphasized signals, due to the non-ideal factors in the synthesizing process, the ideal emphasized signals cannot be synthesized by the prior art.

SUMMARY OF THE INVENTION

The present invention relates to a transmission circuit receiving an input signal and providing a corresponding output signal in a corresponding output node. The transmission circuit includes an auxiliary circuit, providing at least a corresponding auxiliary signal according to the input signal; a transmitter including at least a driving unit, each driving unit individually providing a load current or not in the output node according to the level of the input signal; and at least a charge unit, each charge unit being electrically connected to the output node, and each charge unit being individually corresponding to one of the auxiliary signals. When a level transition occurs in the auxiliary signal corresponding to each charge unit, each charge unit is able to inject different charges in the output node according to the level transition trend, and couple the level of the auxiliary signal to the output node.

The present invention relates to a transmission method for receiving an input signal and providing an corresponding output signal for each input signal accordingly in a corresponding output node. The transmission method includes providing at least a corresponding auxiliary signal according to each input signal. When a level transition occurs in the auxiliary signal corresponding to each input signal, different charges are injected in the output node corresponding to each input signal according to the level transition trend, and the level of the corresponding auxiliary signal is coupled to the output node.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 shows the operation of the transmitter in FIG. 3 affected by charge injection and clock feed-through.

DETAILED DESCRIPTION

Figure 1:
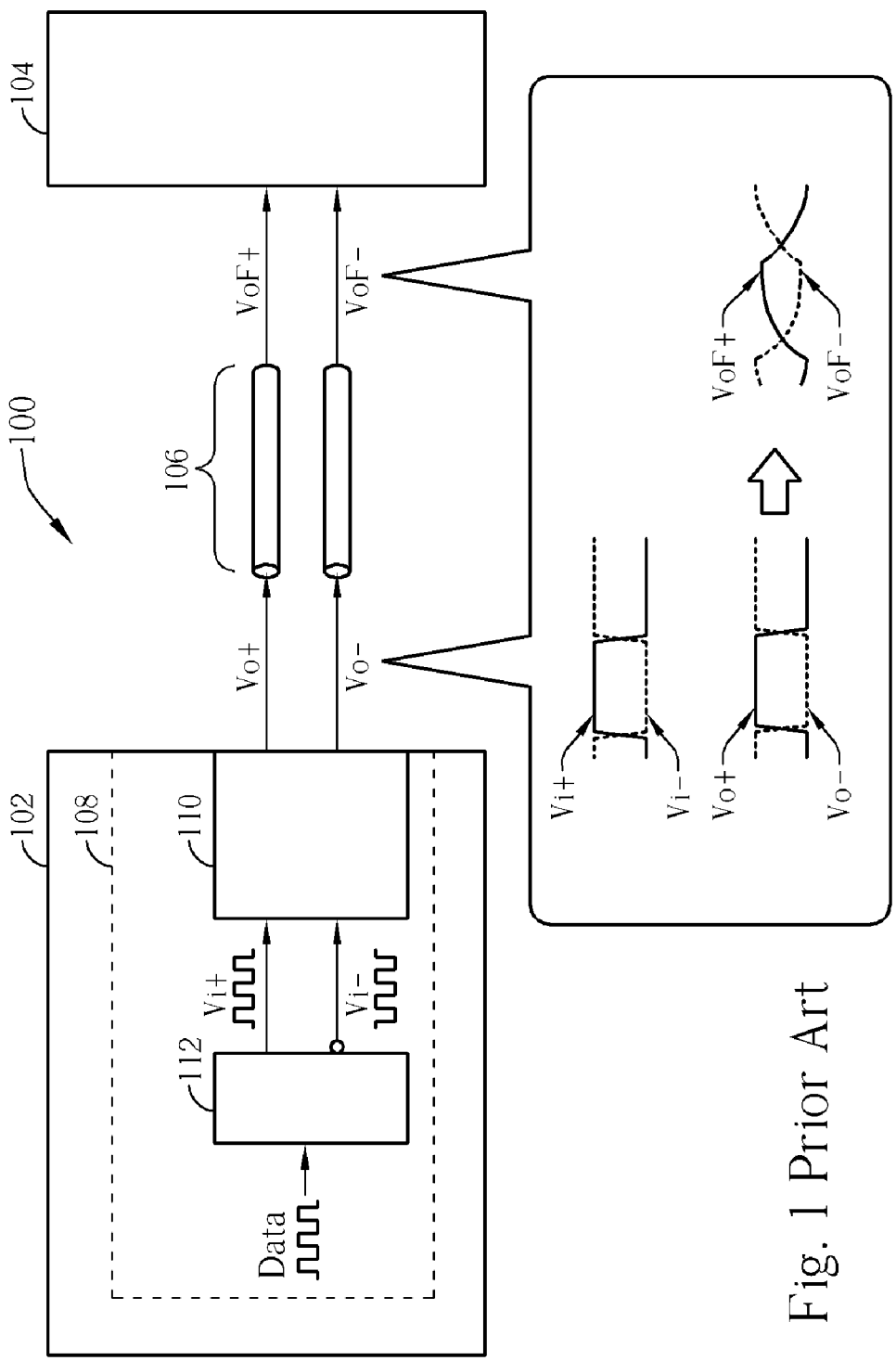
FIG. 1 is a diagram illustrating data transmitted by a transmission circuit to a receiving circuit in an electronic system.

Please refer to FIG. 1, it shows that a transmission circuit 102 transmits data to a receiving circuit 104 in an electronic system 100. As people skilled in the art know, when transmitting data, it is better to resist noise and reduce the effects on other circuits by utilizing differential signals. Thus, in FIG. 1 and below, we discuss the related techniques of the present invention based on differential signal transmission. In the electronic system 100, in order to transmit data in the form of electronic signals to the receiving circuit 104, the transmission circuit 102 is equipped with an output circuit 108 including a transformation circuit 112 and a transmission circuit 110. The datum ready to transmit is taken as an input signal Data which is transformed into two differential signals Vi+ and Vi− by the transformation circuit 112, and the transmission circuit 110 outputs the differential signals Vo+ and Vo− in response to Vi+ and Vi−. The differential output signals Vo+ and Vo− transmit through the bus 106, separately form remote signals VoF+ and VoF− at receiving circuit 104, and are received by the receiving circuit 104. In ideal conditions, the transmission circuit 110 drives the signal Vo+ and the signal Vo− of the same pattern on the bus 106 while the signal VoF+ and the signal VoF− are transmitted and formed separately by the signal Vo+ and the signal Vo− also follow the same pattern as the signal Vo+ and the signal Vo−. However, in fact, as those skilled in the art know, when the signal Vo+ and the signal Vo− are transmitted on the bus 106, the bus 106 leads to a transmission line effect because of the nature of the bus 106, and that affects the quality of the signal transmission and distorts the remote signals VoF+ and VoF− received by the receiving circuit 104. As the patterns show in FIG. 1, the signal Vo+ and Vo− are gradually attenuated and distorted so the information in the remote signals VoF+ and VoF− is hard to recognize when the signals Vo+ and Vo− get to the receiving circuit 104 and form the remote signals VoF+ and VoF−.

Figure 2:
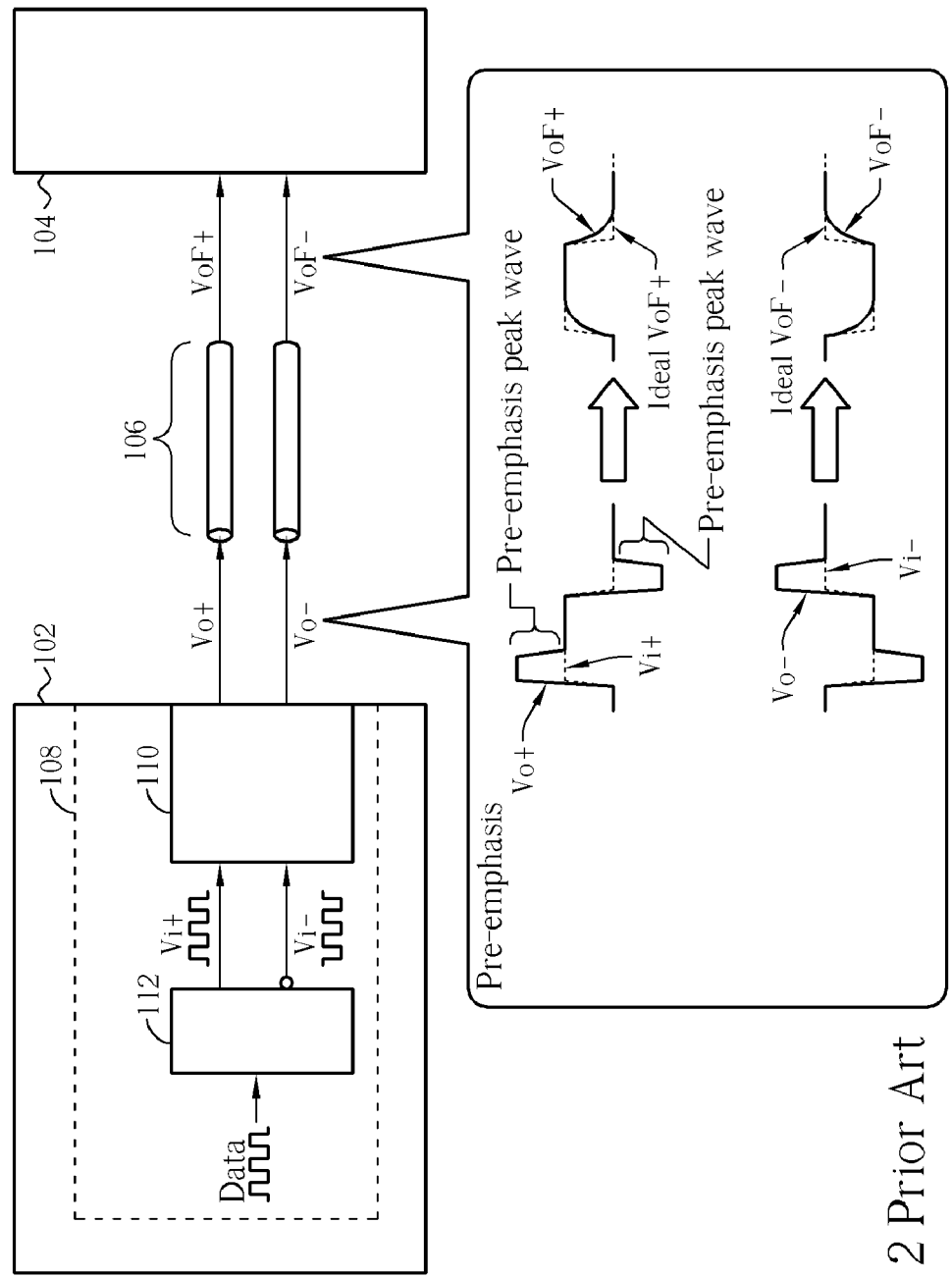
FIG. 2 is a diagram illustrating the utilization of the pre-emphasis in the electronic system in FIG. 1.

To overcome the waveform distortion in FIG. 1, a technique named pre-emphasis is adopted. Following the instance in FIG. 1, please further refer to FIG. 2 illustrating the electronic system 100 transmits signals by the technique of the pre-emphasis. In the transmission circuit 110 in FIG. 2, peak waves of high amplitude are used to emphasize the rising/falling edges of the signals Vo+ and Vo− for resisting the transmission line effect in the bus 106. As the wave shown in FIG. 2, the transmission circuit 110 adds an extra emphasized peak wave at the rising edge of the signals Vo+ and Vo− to give the rising edges of the signals Vo+ and Vo− higher and stronger waveform differences. The emphasized rising edge more strongly drives the remote signals VoF+ and VoF− for steeper rising slopes and closer to the ideal rising edges. Similarly, the transmission circuit 110 adds an extra emphasized peak wave at the falling edges of the signals Vo+ and Vo− to enhance the voltage changes of the remote signals VoF+ and VoF− to have steeper slopes of the remote signals VoF+ and VoF− and to be closer to the ideal falling edges.

Figure 3:
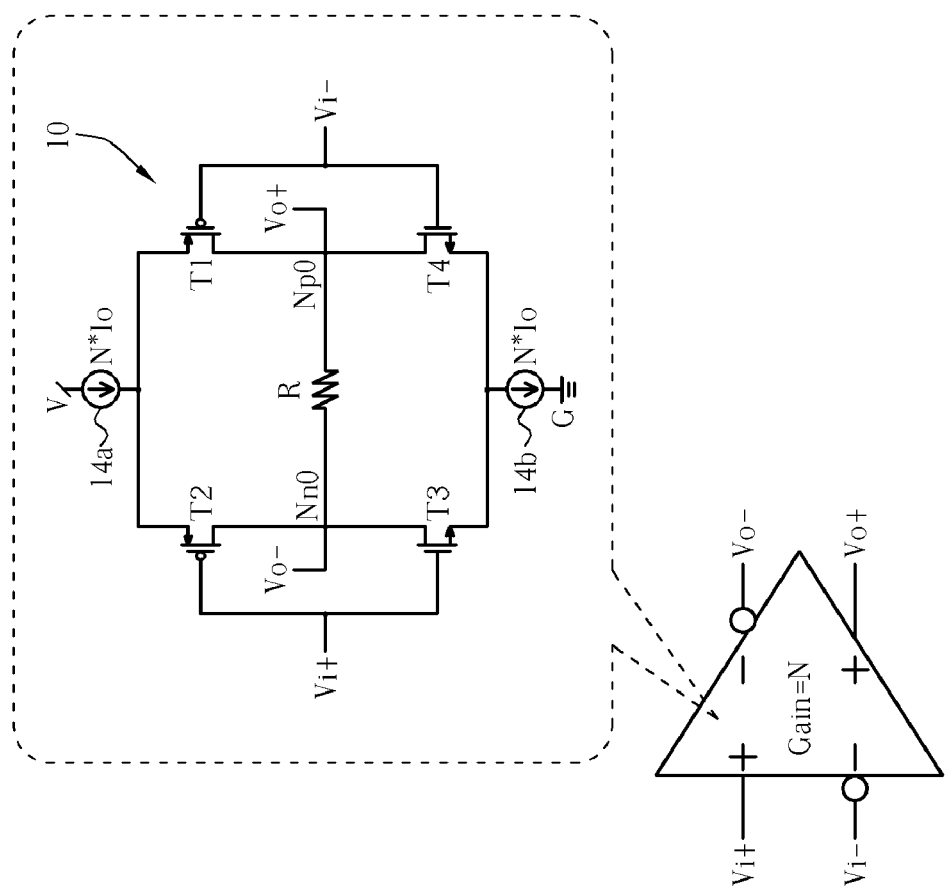
FIG. 3 is a circuit diagram of a conventional differential transmitter.
Figure 4:
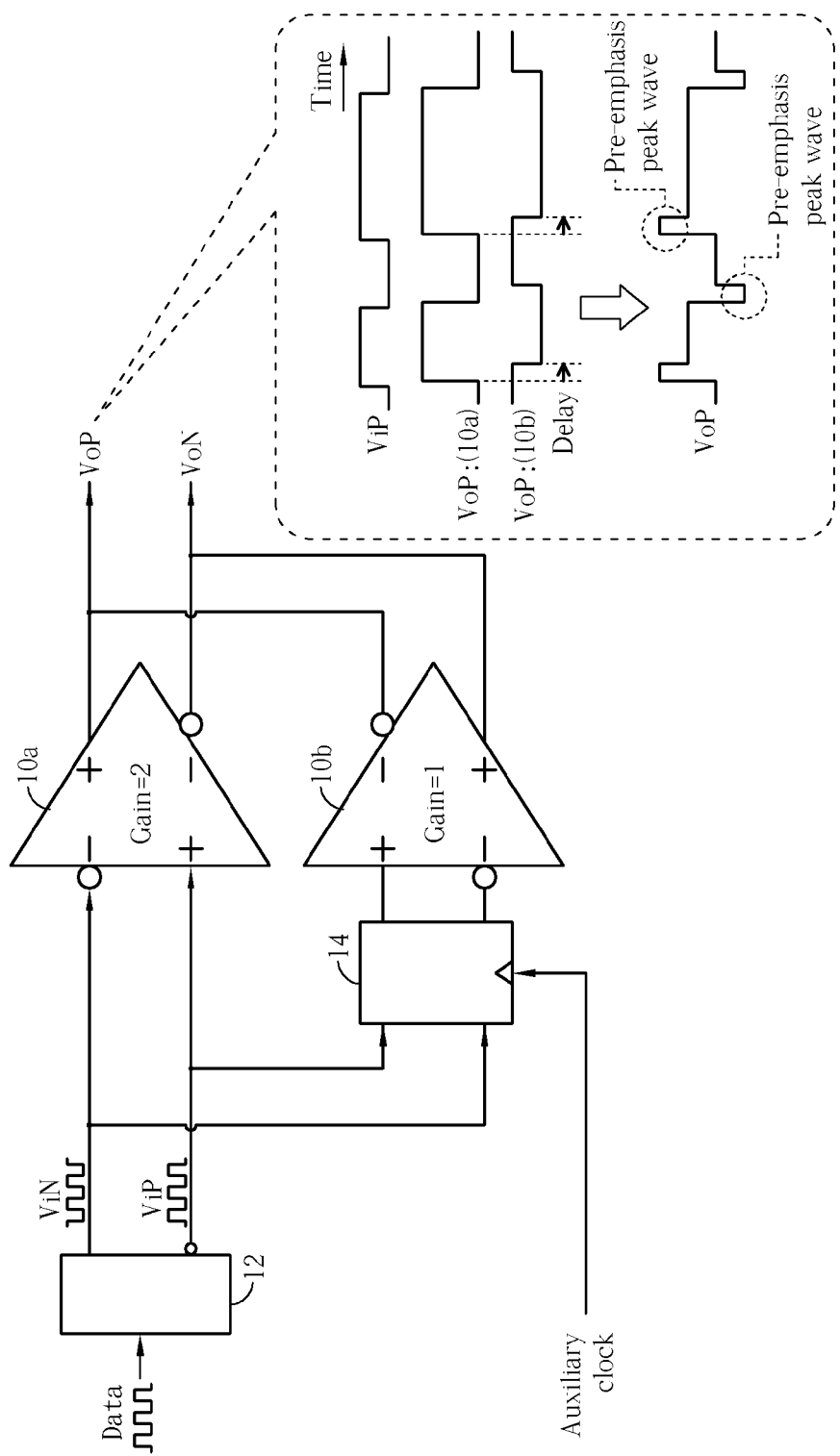
FIG. 4 is a circuit diagram illustrating the realization of pre-emphasis with two transmitters in the prior art.

Please refer to FIG. 3 and FIG. 4, wherein FIG. 3 shows a circuit structure of a conventional differential transmitter 10, and FIG. 4 shows the circuit structure realizing the technique of pre-emphasis by two transmitters in the prior art. First, as shown in FIG. 3, the conventional differential transmitter 10 (in short, transmitter 10) is used to realize the transmission circuit 110 in FIG. 1, which receives two differential input signals Vi+ and Vi− and then outputs the two corresponding differential output signals Vo+ and Vo−. The transmitter 10 is biased between D.C. voltage V and G (such as a plus voltage and a ground voltage) and equipped with two matched PMOS transistors T1, T2 and two matched NMOS transistors T3, T4. A CMOS pair composed of the transistors T1 and T4, whose gate receives the signal Vi− and the drain at the node Np0 transmits the signal Vo+. Another CMOS pair is composed of the transistors T2 and T3 whose gates receive the signal Vi+. The drain at the node Nn0 transmits the signal Vo−. Because the nodes Np0 and Nn0 are the output nodes of the transmitter 10 and couple to the bus (not shown in any FIG.), the resistor R coupled to the nodes Np0 and Nn0 is used to match the equivalent external output impendence caused by the transmission line affects of the bus. On the other hand, the two matched D.C. current supplies 14a and 14b are used to provide load currents to the resistor R.

The operation of the transmitter 10 is described as follows. When the input signal V+ is high and the input signal Vi− is low, the transistors T1 and T3 conduct while the transistors T2 and T4 close. Thus the currents provided by the current supply 14a flow from the node Np0 to the node Nn0 so that the voltage of the node Np0 is higher than the voltage of the node Nn0. Then an output signal Vo+ of high voltage and an output signal Vo− of low voltage are established. Relatively, if the input signal Vi+ is low and the input signal Vi− is high, the transistors T2 and T4 conduct while the transistors T1 and T3 close so that the currents provided by the current supply 14a flow from the node Nn0 to the node Np0. Thus the voltage of the node Nn0 is higher than the voltage of the node Np0. Then an output signal Vo+ of low voltage and an output signal Vo− of high voltage are established. As is known from the description above, the voltage difference between the differential output signals Vo+ and Vo− depends on the resistance of the resistor R and the value of the currents provided by the current supplies 14a and 14b. In the condition of the fixed value of the resistor R for matching the impendence, if we want to change the gain of the transmitter 10, we can use the current supplies 14a and 14b with different current values. For instance, if the value of the current provided by the current supplies 14a and 14b is Io, the gain of the transmitter is 1. Then if we want the gain of the transmitter 10 to be N, the value of the current provided by the current supplies 14a and 14b should be N*Io.

The transmitter 10 in FIG. 3 is directly used to realize the transmitter 110 in FIG. 1. However, the technique of pre-emphasis in FIG. 2 cannot be realized with only a single conventional differential transmitter 10. As shown in FIG. 4, to realize the technique of pre-emphasis, conventionally two transmitters with different gains operate with an inverter are needed. In the prior art in FIG. 4, the output circuit 108 in FIG. 2 is realized with a transformation circuit 12, a flip-flop, and two transmitters 10a and 10b. The function of the transformation circuit 12 is as the same as the function of the transformation circuit 112 in FIG. 1 and FIG. 2. The flip-flop 14 as a clock delay circuit receives a trigger of the helping clock and delays its input to its output. To realize the emphasized peak waves of the technique of the pre-emphasis, the gain of the transmitter 10a is twice that of the transmitter 10b, and the output nodes of the transmitters 10a and 10b are inversely coupled. In other words, the positive output node of the transmitter 10a couples to the negative output node of the transmitter 10b for outputting the signal VoP, while the negative output node of the transmitter 10a couples to the positive output node of the transmitter 10b for outputting the signal VoN.

In the prior art of FIG. 4, the ready transmission data (the input signal Data) are transformed into two differential signals ViN and ViP by the transformation circuit 12. The two differential signals are inputted into the transmitter 10a and also inputted through the flip-flop 14 into another transmitter 10b. Take the signal ViP for example. As the waveform shows in FIG. 4, the transmitter 10a provides signals of double positive gain while the transmitter 10b provides delayed signals of unit negative gain because of the delay of the flip-flop 14 (because the transmitters 10a and 10b are inversely coupled at their output nodes). In the signal VoP, the peak wave of pre-emphasis is formed by the affects of the two transmitters 10a and 10b, which realizes the technique of pre-emphasis in FIG. 2.

However, there are still disadvantages in the prior art in FIG. 4. First, the prior art uses two transmitters 10a and 10b with different gains to synthesize the emphasized transmitted signals. In this way, the power dissipation increases and more layout area is used. Second, the prior art in FIG. 4 needs a flip-flop 14 as a clock delay circuit to appropriately synthesize emphasized signals. The clock delay circuit needs an extra clock to trigger itself for operation.

In addition, in the prior art in FIG. 4, besides the disadvantage of the circuit placement, the transmitter of the prior art is interfered with by some non-ideal factors, e.g. the charge injection and clock feed-through. Even by using two transmitters matched with a clock delay circuit to synthesize emphasized signals, due to the non-ideal factors in the synthesizing process, the ideal emphasized signals cannot be synthesized by the prior art.

Figure 5:
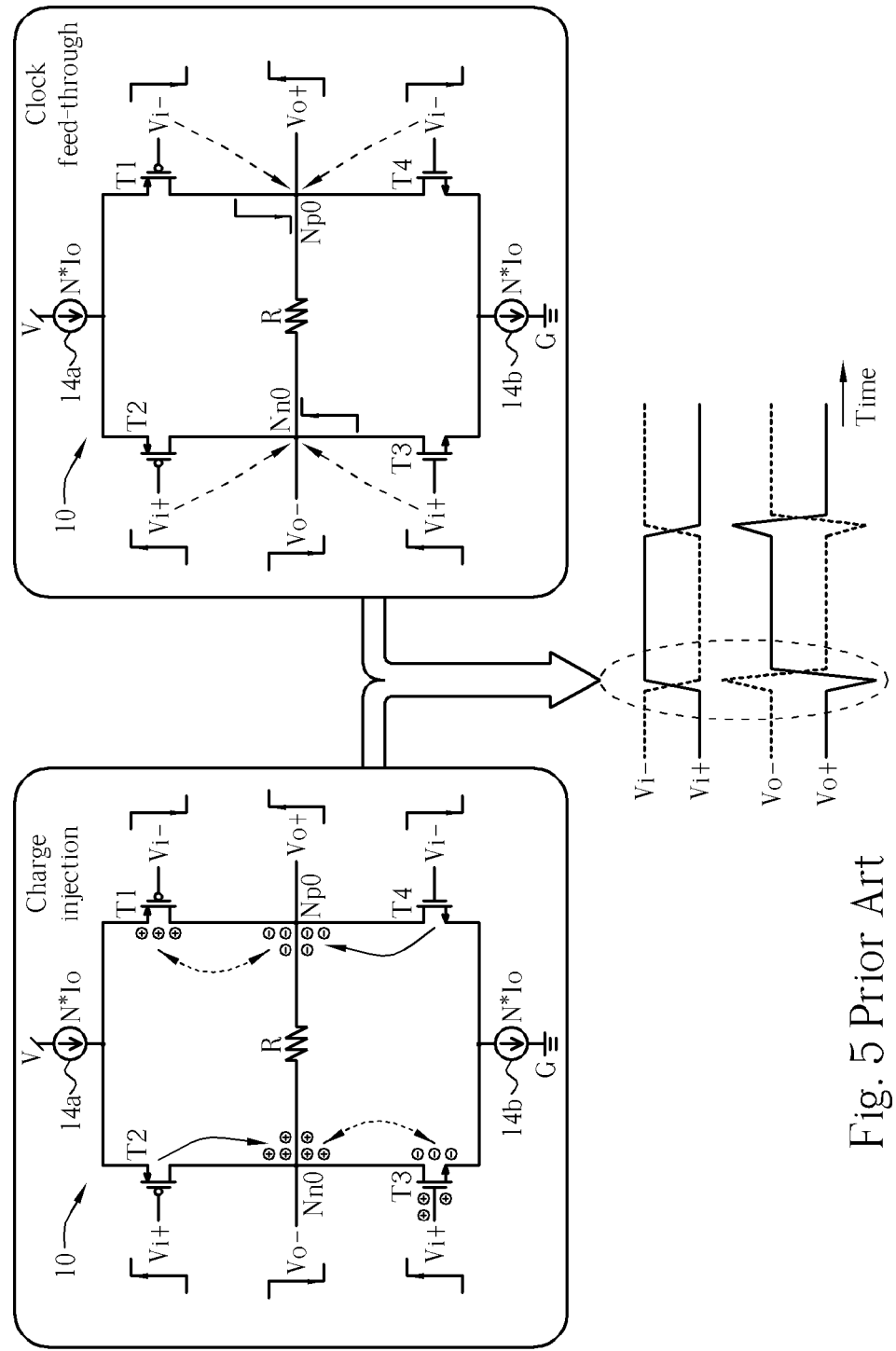

Please refer to FIG. 5, FIG. 5 shows the operation of the transmitter 10 in FIG. 3 affected by the charge injection and clock feed-through. As shown in the left side of FIG. 5, when the level transition occurs in the input signals Vi+ and Vi−, some non-ideal factors such as charge injection and clock feed-through that will affect the level transition occurs in the input signals Vi+ and Vi−. When the input signal Vi+ changes from low to high and the input signal Vi− changes from high to low, the closed transistors T1, T3 become conducting. Therefore, the transistor T1 absorbs the negative charges from the node Nn0, and the positive charges are accumulated in the node Nn0. The transistor T3 absorbs the positive charges from the node Np0, and the negative charges are accumulated in the node Nn0. On the other hand, when the input signal Vi+ changes from low to high and the input signal Vi− changes from high to low, the conducting transistors T2, T4 become closed. Therefore, the transistor T2 releases the positive charges for conducting in the drain/source, and the positive charges are accumulated in the node Nn0. The transistor T4 releases the negative charges for conducting in the source/drain and negative charges are still accumulated in the node Np0. This means when the transistors T1, T3 become conducting and the transistors T2, T4 become closed, the positive and negative charges are temporarily accumulated in the node Nn0 and Np0 separately. Accumulation of the positive charges increases the voltage in the node Nn0, and accumulation of the negative charges decreases the voltage in the node Np0. However, when the input signal Vi+ changes from low to high and the input signal Vi− changes from high to low, the output signal Vo+ in the node Np0 should change from low to high, so the normal level transition of the signal output Vo+ is impeded by the accumulated negative charges in the Np0, i.e., the voltage supposed to be increased in the node Np0 is impeded. The output signal Vo− in the node Nn0 should change from high to low, so the normal level transition of the output signal Vo− is impeded by the accumulated positive charges in the node Nn0, i.e., the voltage supposed to be decreased in the node Nn0 is impeded. This is the influence of the transient charge injection on the prior art transmitter 10.

As shown in the right side of FIG. 5, when the input signal Vi+ changes from low to high and the input signal Vi− changes from high to low, the input signal Vi+ is coupled to the node Nn0, and the voltage of the node Nn0 is coupled to the transient upside from the input signal Vi+. However, the output signal Vo− is supposed to be low, so coupling of the input signal Vi+ and the node Nn0 will interfere the normal level transition of the output signal Vo− to form the interference of clock feed-through. The input signal Vi− is coupled to the node Np0, and the voltage of the node Np0 is coupled to the transient downside from the input signal Vi− to interfere the normal level transition of the output signal Vo+ that is supposed to be high.

As shown in the waveforms in FIG. 5, due to the charge injection and clock feed-through, the transmitter 10 causes an opposite transient peak wave in the rising and falling edge of the output signals Vo+, Vo− that interferes with the normal level transition of the output signals Vo+, Vo−. When the output signals Vo+, Vo− change from low to high, the output signals Vo+, Vo− have to be a lower level first and then normally rise to a high level. When the output signals Vo+, Vo− change from high to low, the output signals Vo+, Vo− have to be a higher level first and then normally rise to a low level. This non-ideal transient not only affects the normal signal transmission, but also seriously affects the pre-emphasis waveforms in the realization of pre-emphasis. Compared with FIG. 2, the realization of pre-emphasis should emphasize the upside in the rising edge of the output signals Vo+, Vo−, and emphasize the downside in the falling edge of the output signals Vo+, Vo−. In FIG. 5, the non-ideal transient falls in the rising edge and rises in the falling edge of the output signals Vo+, Vo−, which is absolutely opposite to the supposed trend of the pre-emphasis waveforms. Therefore, the prior art transmitter 10 is not suitable for realization of pre-emphasis. In another prior art, NMOS are used as the transistors T1 and T2 in FIG. 3, and the input signals Vi−/Vi+ are separately used to drive the transistors T2/T1, but this prior art still can not avoid the charge injection and clock feed-through caused by each driving unit due to the body effect of each transistor.

In order to overcome the disadvantages of the prior art, the present invention provides a transmitter and transmission circuit with better structure, which not only properly compensate the charge injection and clock feed-through in the transmitter, but also realize the pre-emphasis in the single transmitter, and improve the signal transmission quality of the system with lower power consumption and simpler circuit layout. Please refer to FIG. 6, which is a circuit diagram of the transmitter 20 and the transmission circuit 30 of the present invention. The transformation circuit 22 and the transmission circuit 30 are positioned in the transmission circuit (Please refer to FIG. 1 and FIG. 2.) to drive the ready-for-transmission signals as the output signals Vo+, Vo− and transmit to the receiving circuits. The transformation circuit 22 can transform the ready-for-transmission signals to the differential input signals Vi+, Vi−, and the input signals Vi+, Vi− are input to the transmitter 20 in the transmission circuit 30, and the transmitter 20 can output the output signals Vo+, Vo− accordingly.

The transmitter 20 of the present invention is biased between the D.C. voltages V and G and equipped with two matched PMOS transistors M1 and M2 and two matched NMOS transistors M3 and M4. The transistors M1 and M4 are formed into a CMOS pair while the transistors M2 and M3 are formed into another CMOS pair. The two CMOS pairs are formed into two matched driving circuits. Each of the driving circuits corresponds to an input signal and an output node. Each driving circuit individually provides currents of different directions at the corresponding output nodes in response to voltages of the corresponding signals. For example, the drive circuit composed of the PMOS transistor M2 and NMOS transistor M3 receives the input signal Vi+ with the gates of the two transistors and transmits the output signal Vo− with its output node Nn coupled with the drains of the two transistors. Similarly, another circuit composed of PMOS transistor M1 and NMOS transistor M4 is controlled by the input signal Vi− with the gates of the two transistors and transmits the output signal Vo+ at the node Np coupled with the drains of the two transistors. Additionally, while two matched load resistors Rp and Rn are individually coupled to the two output nodes Np and Nn as two load units, the transmitter 20 is also equipped with two matched constant D.C. current supplies 24a and 24b, both of which provide a constant value of load constant D.C. current I. In addition, the resistor R is electrically connected between the output nodes Np and Nn to receive the load current I and produce output signals Vo+, Vo−, and match the equivalent output impendence in the output nodes Np and Nn. During the operation of the transmitter 20, each driving unit conducts the load current I or not in response to the level of the input signals, and drives the output signals Vo+, Vo− in the corresponding output nodes. For example, when the input signal Vi+ is high and the input signal Vi− is low, the transistors M1 and M3 are conducting and the transistors M2 and M4 are closed (not conducting). The conducting transistors M1 and M3 conduct the load current I from the node Np to the node Nn, i.e., produce the high level output signal Vo+ in the node Np and produce the low level output signal Vo− in the node Nn. On the contrary, when the input signal Vi+ is low and the input signal Vi− is high, the transistors M1 and M3 are closed and the transistors M2 and M4 are conducting. The conducting transistors M2 and M4 conduct the load current I from the node Nn to the node Np, i.e., produce the low level output signal Vo+ in the node Np and produce the high level output signal Vo− in the node Nn.

Figure 6:
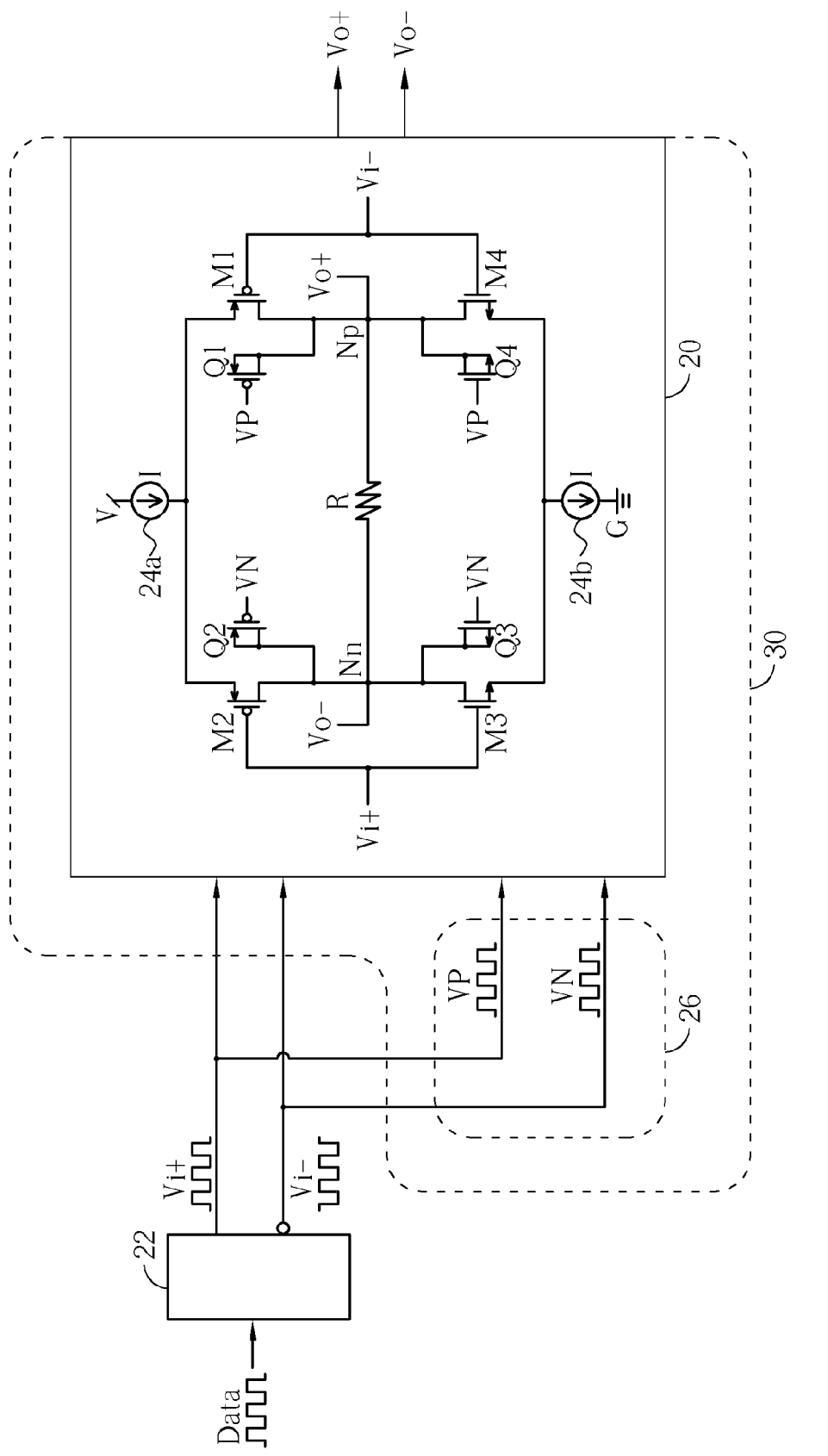
FIG. 6 is a circuit diagram of the transmitter and the transmission circuit of the present invention.

Besides each driving unit, the charge unit includes a MOS transistor electrically connected in capacitor form positioned in the transmitter 20. In FIG. 6, the four corresponding charge units including the MOS transistors Q1 to Q4 are positioned separately in the transmitter 20 for the four driving unit transistors M1 to M4 accordingly. One side of each of the transistors Q2, Q3 is electrically connected to the node Nn, and the other side receives a corresponding auxiliary signal VN to compensate for the non-ideal effect of the transistors M2, M3 in the node Nn according to the auxiliary signal VN driving. The transistors Q1, Q4 are separately corresponding to the driving unit transistors M1, M4. One side of each of the transistors Q1, Q4 is electrically connected to the node Np, and the other side receives a corresponding auxiliary signal VP to compensate for the non-ideal effect of the transistors M1, M4 in the node Np according to the auxiliary signal VP driving. The auxiliary signals VN and VP are provided by an auxiliary circuit 26. In FIG. 6, the auxiliary circuit 26 uses the input signal Vi+ as the auxiliary signal VP, and the input signal Vi− as the auxiliary signal VN. Since the input signals Vi+ and Vi− are inverse differential signals, equivalently the auxiliary circuit 26 provides the auxiliary signals VN and VP according to the inverse of the input signals Vi+ and Vi−.

Figure 7:
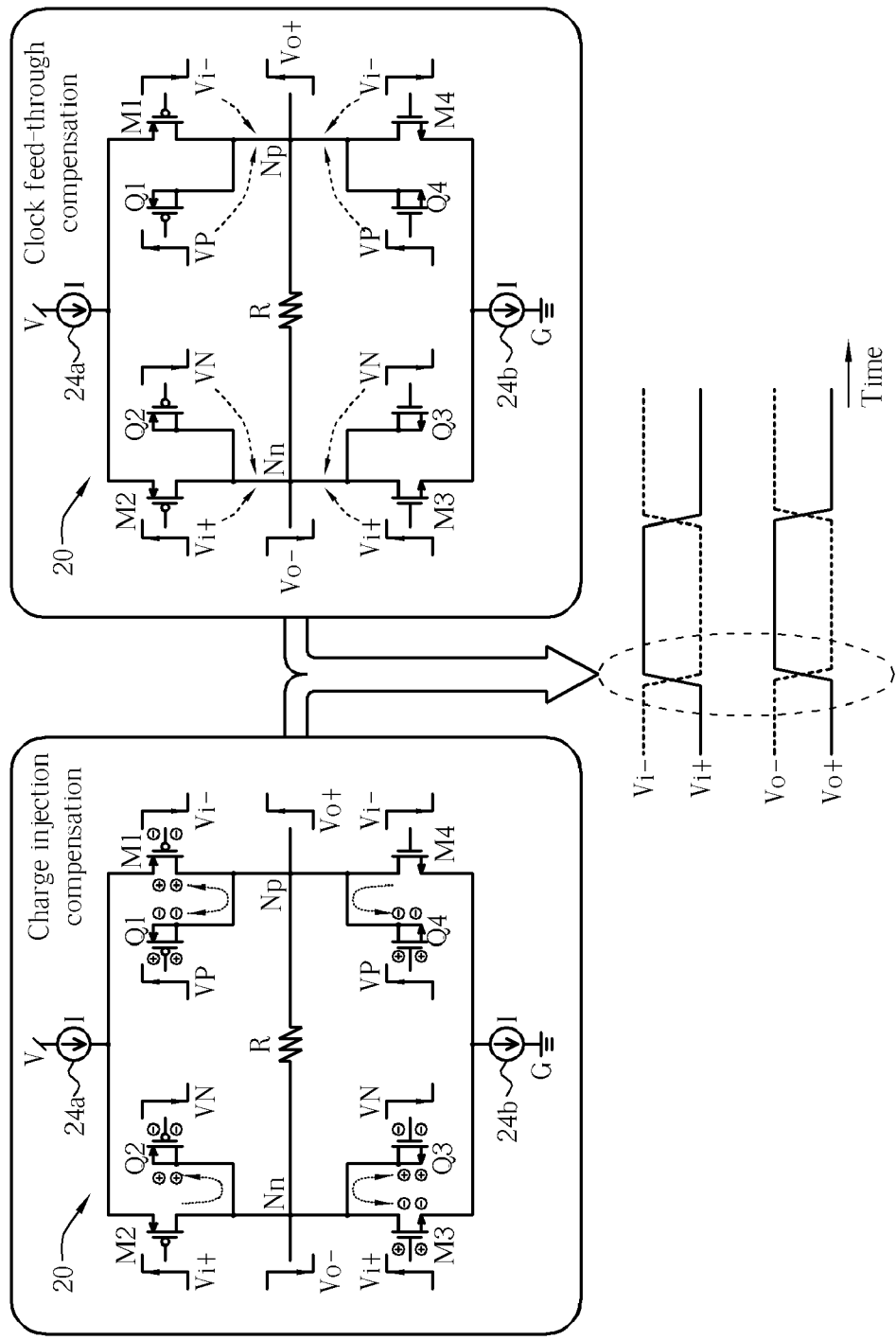
FIG. 7 shows the operation of the transmitter in FIG. 6 when a level transition occurs in the input and output signals.

When a level transition occurs in the auxiliary signal corresponding to each input signal, different charges are injected by the charge units in the output node corresponding to each input signal according to the level transition trend, and the level of the corresponding auxiliary signal is coupled to the output node to compensate for the non-ideal effects due to charge injection and clock feed-through in the driving units operation. Adjusting the equivalent capacitors of each charge unit can control the compensation level of the present invention. Please refer to FIG. 7 for a further illustration. Assuming each charge unit Qx matches the corresponding driving unit Mx (x=1~4), the operation of each charge unit and the corresponding driving unit can be illustrated by FIG. 7. FIG. 7 shows the operation of the transmitter in FIG. 6 when a level transition occurs in the input and output signals.

As shown in the left side of FIG. 7, when the input signal Vi+ changes from low to high and the input signal Vi− changes from high to low, the closed transistors M3, M1 become conducting. Therefore, the transistor M3 absorbs the negative charges from the node Nn, and the positive charges are injected to the node Nn equivalently. Since the auxiliary signal VN changes from high to low, the charge unit Q3 starts to absorb the positive charges from the node Nn, and the transistor Q3 can absorb the positive charges injected by the transistor M3 to the node Nn to compensate the charge injection cause by the transistor M3 to the node Nn. In fact, since the transistors M3 and Q3 match each other, the positive charges injected to the node Nn by the transistor M3 equal the positive charges absorbed by the transistor Q3, and the normal level transition of the output signal Vo− will not be impeded by the positive charge injection of the transistor M3 in the node Nn. In the same way, when the closed transistor M1 becomes conducting due to Vi− changes from high to low, the transistor M1 absorbs the positive charges and the negative charges are injected to the node Np. Since the auxiliary signal VP changes from low to high, the charge unit Q1 starts to absorb the negative charges from the node Np, and the transistor Q1 can absorb the negative charges injected by the transistor M1 to the node Np to compensate for the charge injection caused by the transistor M1 to the node Np. The normal level transition of the output signal Vo− will not be impeded by the positive charge injection of the transistor M1 in the node Np.

On the other hand, when the input signal Vi+ changes from low to high and the input signal Vi− changes from high to low, the conducting transistors M2 and M4 become closed. Therefore, the transistor M2 injects the positive charges to the node Nn. Since the auxiliary signal VN changes from high to low, the transistor Q2 starts to absorb the positive charges from the node Nn. Since the transistors M2 and Q2 match each other, the positive charges injected to the node Nn by the transistor M2 equal the positive charges absorbed by the transistor Q2, and the normal level transition of the output signal Vo− will not be impeded by the positive charge injection of the transistor M2 in the node Nn. In the same way, when the conducting transistor M4 becomes closed due to Vi− changes from high to low, the transistor M4 injects the negative charges to the node Np. Since the auxiliary signal VP changes from high to low, the transistor Q4 starts to absorb the negative charges from the node Np. Since the transistors M4 and Q4 match each other, the negative charges injected to the node Np by the transistor M4 equal the negative charges absorbed by the transistor Q4, and the normal level transition of the output signal Vo+ will not be impeded by the negative charge injection of the transistor M4 in the node Np.

When the driving unit Mx (x=1~4) changes operation state according to the input signal, each corresponding charge unit Qx is driven inversely by the corresponding auxiliary signal to compensate for the charge injection of each driving unit Mx to each output node. Besides, each charge unit Qx can compensate for the clock feed-through of each driving unit Mx to each output node. As shown in the right side of FIG. 7, when the input signal Vi+ changes from low to high and the input signal Vi− changes from high to low, the transistors M3 and M2 couple the upside of the input signal Vi+ to the node Nn. In the meantime, the corresponding transistors Q3 and Q2 couple the downside of the inverse auxiliary signal VN to the node Nn. Since the transistors M2, Q2 and transistors M3, Q3 match each other, the upside of the transistor M2 coupling to the node Nn is offset by the downside of the transistor Q2 coupling to the node Nn. The upside of the transistor M3 coupling to the node Nn is offset by the downside of the transistor Q3 coupling to the node Nn, and the transistors M3 and M2 will not affect the normal level transition of the output signal Vo− in the node Nn due to the coupling of the input signal Vi+.

On the other hand, when the input signal Vi+ changes from low to high and the input signal Vi− changes from high to low, the transistors M1 and M4 couple the downside of the input signal Vi− to the node Np. In the meantime, the corresponding transistors Q1 and Q4 couple the upside of the inverse auxiliary signal VP to the node Np, and the transistors M1 and M4 will not affect the normal level transition of the output signal Vo+ in the node Np due to the coupling of the input signal Vi−.

In summary, the present invention uses the inverse driving of each charge unit Qx to compensate the charge injection and clock feed-through of each driving unit Mx so that the output signals Vo+ and Vo− output by the transmitter 20 will not be affected by these factors. As shown in FIG. 7, since each charge unit Qx matches to each corresponding driving unit Mx, the transient triggered by each driving unit is completely offset, and the output signals Vo+ and Vo− output by the transmitter 20 have good rising and falling edges. Since the prior art transmitters in FIG. 3 and FIG. 5 do not have the charge unit of the present invention, the output signals Vo+ and Vo− have the non-ideal transient.

Please note that the compensation of the charge unit Qx to the driving unit Mx is not concerned with the process variation and the operation temperature, although the process variation and the operation temperature can change the transistor properties. The present invention uses the same transistors to form the charge unit Qx and the corresponding driving unit Mx, and even though the transistor properties are changed, they are changed in the same trend, so the compensation of the charge unit Qx to the driving unit Mx is still constant.

Although the charge units Q1 to Q4 in capacitor form are electrically connected in the output nodes Nn and Np in the present invention, the present invention does not increase the equivalent output loading in the output nodes Nn and Np. Because both sides of the capacitor of the charge units have the same signal level, driving loading of the output signal is not increased in the output nodes. For example, one side of each of the charge units Q2 and Q3 is electrically connected to the output signal Vo−, and the other side is electrically connected to the auxiliary signal VN. Since the signals Vo− and VN change in the same phase, there is no stable-state constant voltage bias between the two sides of the capacitor in the charge units Q2 and Q3, and driving loading of the transmitter 20 to the node Nn is not increased. In the same way, the charge units Q1 and Q4 do not increase the equivalent output loading in the output nodes Np.

Furthermore, the transmitter 20 can realize the pre-emphasis shown in FIG. 2. Please refer to FIG. 8, if the surface size of each charge unit Qx is bigger than the corresponding driving unit Mx in FIG. 6, pre-emphasis technique can be realized by the single transmitter 20, the theory being shown in FIG. 8.

Figure 8:
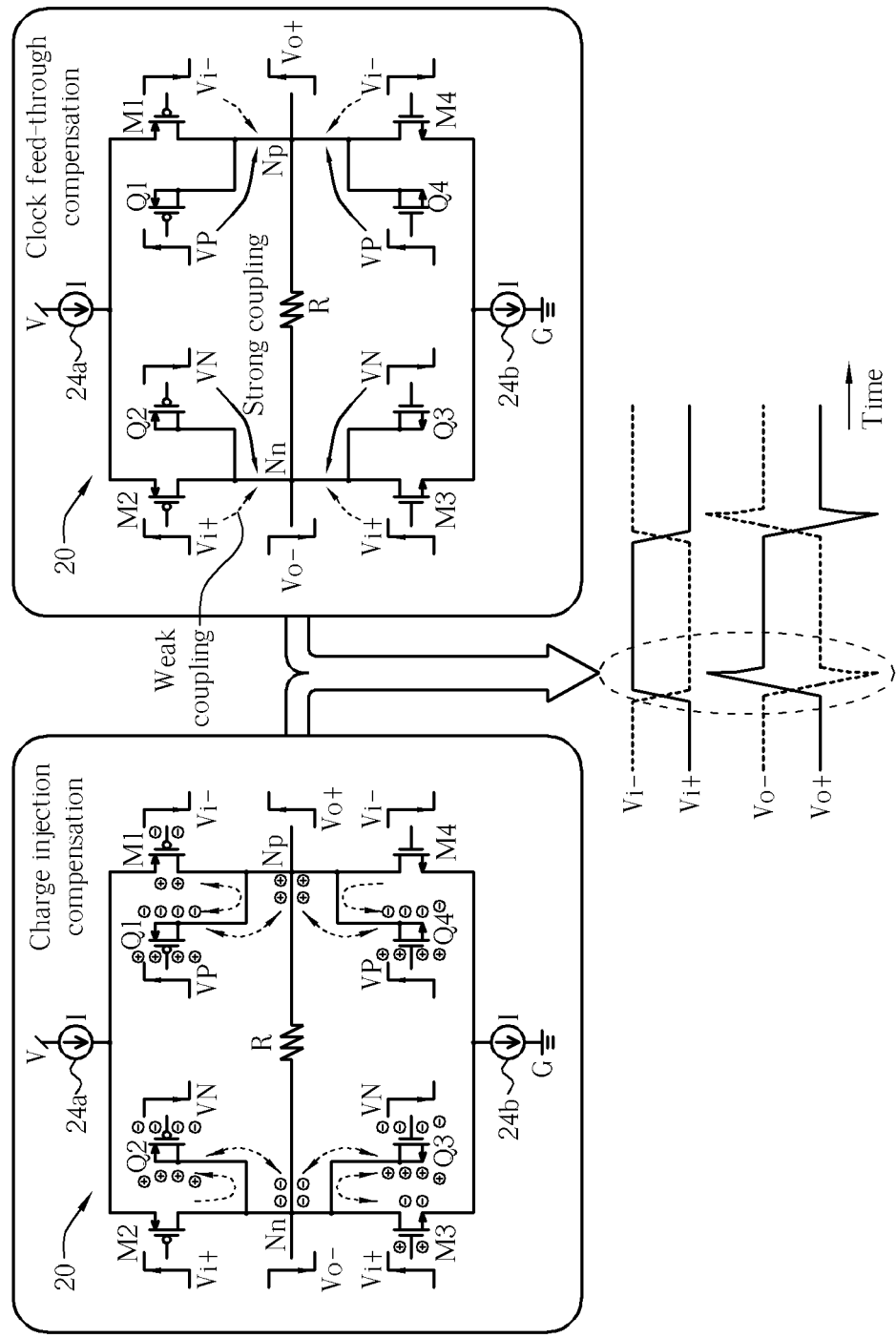
FIG. 8 shows the realization of pre-emphasis with the transmitters in FIG. 6.

As shown in the left side of FIG. 8, when the input signal Vi+ changes from low to high and the input signal Vi− changes from high to low, the closed transistors M3, M1 become conducting, and the conducting transistors M2, M4 become closed. Therefore, the transistor M3 driven by the input signal Vi+ absorbs the negative charges from the node Nn, and the positive charges are injected to the node Nn equivalently. The charge unit Q3 driven by the inverse auxiliary signal VN starts to absorb the positive charges from the node Nn. Since the surface size of the transistor Q3 is bigger than the transistor M3, the transistor Q3 can absorb more positive charges than that injected by the transistor M3, and the negative charges are injected to the node Nn equivalently. Therefore, the extra negative charges are accumulated in the node Nn to lower the voltage in the node Nn and enhance the downside of the output signal Vo− from high to low. In the same way, when the closed transistor M1 becomes conducting due to Vi− changes from high to low, the transistor M1 absorbs the positive charges and the negative charges are injected to the node Np equivalently. In the mean time, the auxiliary signal VP changes from low to high, and the charge unit Q1 starts to absorb the negative charges from the node Np. Since the surface size of the transistor Q1 is bigger than the transistor M1, the transistor Q1 can absorb more negative charge than that injected by the transistor M1 to the node Np, and the positive charges are injected to the node Np equivalently. Therefore, the extra positive charges are accumulated in the node Np to increase the voltage in the node Np and enhance the upside of the output signal Vo+ from low to high.

On the other hand, when the input signal Vi+ changes from low to high and the input signal Vi− changes from high to low, the conducting transistors M2 and M4 become closed. The transistor M2 injects the positive charges, and the transistor Q2 driven by the auxiliary signal VN starts to absorb the positive charges. Since the surface size of the transistor Q2 is bigger than the transistor M2, the transistor Q2 can absorb more positive charges than that injected by the transistor M2, and the negative charges are injected to the node Nn equivalently to enhance the downside of the output signal Vo−. In the same way, the transistor M4 injects the negative charges, and the transistor Q4 driven by the auxiliary signal VP starts to absorb the negative charges. Since the surface size of the transistor Q4 is bigger than the transistor M4, the transistor Q4 can absorb more negative charges than that injected by the transistor M4, and the positive charges are injected to the node Np equivalently to enhance the upside of the output signal Vo+.

As shown in the right side of FIG. 8, when the input signal Vi+ changes from low to high and the input signal Vi− changes from high to low, the transistors M3 and M2 couple the upside of the input signal Vi+ to the node Nn. In the meantime, the corresponding transistors Q3 and Q2 couple the downside of the inverse auxiliary signal VN to the node Nn. Since the surface size of the transistors Q2, Q3, is bigger than the transistors M2, M3, the transistors Q2, Q3 have stronger coupling with the node Nn, and not only offset the clock feed-through of the transistors M2,M3, but also enhance voltage downside in the node Nn. In the same way, the transistors Q1, Q4 not only offset the clock feed-through of the transistors M1, M4, but also enhance voltage upside in the node Np.

As shown in the waveforms in FIG. 8, the present invention not only offsets the clock feed-through and charge injection in of the output signals Vo+, Vo−, but also forms enhanced peak waves in the rising/falling edge of the output signals Vo+, Vo− by the charge units with bigger surface size. The peak waves can be used for the realization of pre-emphasis in FIG. 2, and properties of the output signals Vo+, Vo− are improved by the extra rising/falling waveforms in the rising/falling edge.

The present invention transmitter 20 can not only offset the non-ideal effect caused by each driving unit, but also realize pre-emphasis technique with a single transmitter by adjusting the compensation level of each charge unit Qx and corresponding driving unit Mx. The present invention not only realizes the pre-emphasis technique with simplified circuitry and smaller layout area in the single transmitter, but also lowers power consumption of the pre-emphasis technique. Since each charge unit Qx is driven by the auxiliary signal, D.C. power is not constantly consumed when the signals maintain in a steady-state level, and D.C. power is only consumed in a short period when the level transition occurs in the signals. In comparison with the prior art in FIG. 4, the prior art constantly consumes D.C. power whether the level transition occurs in the signals or not. In FIG. 7 and 8, the present invention adjusts the compensation level of each charge unit Qx and corresponding driving unit Mx by changing the square measure of the charge units, but there are still other methods in the present invention. Take FIG. 7 for example, even though each charge unit Qx matches each corresponding driving unit Mx, the auxiliary signal with bigger amplitude can be used to drive each charge unit to enhance the compensation level for the realization of pre-emphasis.

Figure 9:
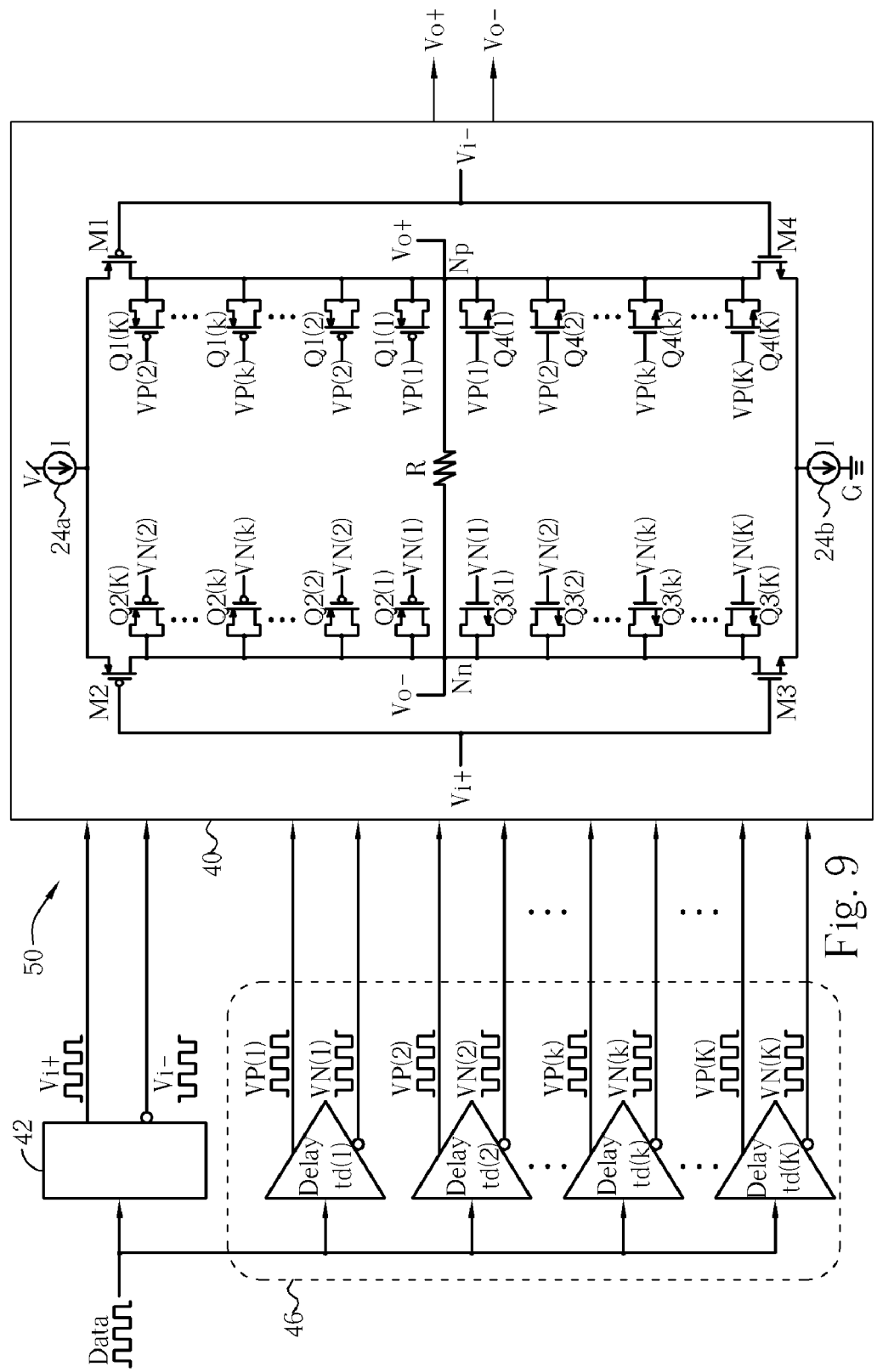
FIG. 9 shows another embodiment of the transmitter and the transmission circuit of the present invention.

In FIG. 6 to FIG. 8, each charge unit Qx is provided for each driving unit Mx accordingly. In the present invention, a plurality of charge units also can be provided for each driving unit, and different delay auxiliary signals can be used to drive the charge units to synthesize a pre-emphasis peak wave in the output signals in the output node. Please refer to FIG. 9. FIG. 9 shows another embodiment of the transmitter and the transmission circuit of the present invention. The transmission circuit 50 includes a transmitter 40 and an corresponding auxiliary circuit 46. The transformation circuit 42 can transform the ready-for-transmission signals to the differential input signals Vi+, Vi−. The input signals Vi+, Vi− are input to the transmitter 40, and the transmitter 40 can output the output signals Vo+, Vo− accordingly.

Similar with the transmitter 20 in FIG. 6, the transmitter 40 in FIG. 9 of the present invention is also biased between the D.C. voltages V and G and equipped with two matched PMOS transistors M1 and M2, and two matched NMOS transistors M3 and M4. The two CMOS pairs are formed into two matched driving circuits, and the transmitter 40 is also equipped with two matched constant D.C. current supplies 24a and 24b, both of which provide a constant value of load constant D.C. current I. During the operation of the transmitter 40, the transistors M2/M3 and M1/M4 conduct the different direction load current I to the resistor R according to the level of the input signals Vi+, Vi−, and output the corresponding output signals Vo−, Vo+ at the output nodes Nn and Np.

Different from the transmitter 20 in FIG. 6, in the embodiment of FIG. 9, the present invention provides a plurality of corresponding charge units Qx(1), Qx(2) . . . Qx(K) (K is constant, x=1~4) for each driving unit Mx. Each charge unit Qx(k)(k=1~K) uses a capacitor form MOS transistor as an equivalent capacitor, and the MOS transistor of each charge unit Qx(k) can be the same type as the transistor of each driving unit Mx. As shown in FIG. 9, the charge units Q1(1) to Q1(K) formed by PMOS transistors are positioned for PMOS transistor M1. In the same way, the charge units Q2(1) to Q2(K) formed by PMOS transistors are positioned for PMOS transistor M2. The charge units Q3(1) to Q3(K) and Q4(1) to Q4(K) formed by NMOS transistors are positioned for NMOS transistor M3 and M4.

The auxiliary circuit 46 also provides a plurality auxiliary signals VP(1) to VP(K) and VN(1) to VN(K) to separately control the charge units Q1(1)/Q4(1) to Q1(K)/Q4(K) and Q2(1)/Q3(1) to Q2(K)/Q3(K). In the embodiment of FIG. 9, the auxiliary circuit 46 can be a phase generator to provide two differential auxiliary signals VP(k) and VN(k) according to the delay time td(k) (k=1~K) of the ready-for-transmission data. The auxiliary signals VP(k) are in the same phase as the ready-for-transmission data, and they are only different in delay time td(k), and the auxiliary signal VN(k) is inverse to VP(k). Since differential input signals Vi+ and Vi− are also triggered by the ready-for-transmission data, the auxiliary signals VP(k) and VN(k) are delay signals of the input signals Vi+ and Vi− equivalently. For a constant k, the auxiliary signals VP(k) are the inverse and delay subsequence of the input signal Vi−, and the auxiliary signals VN(k) are the inverse and delay subsequence of the input signal Vi+. Please note that the circuit diagram of the auxiliary circuit 46 in FIG. 9 is only used to illustrate the delay relation between the auxiliary signals VP(k)/VN(k) and the ready-for-transmission data. In the realization of the auxiliary circuit 46, a plurality of series differential inverters can be used to provide the auxiliary signals.

Figure 10:
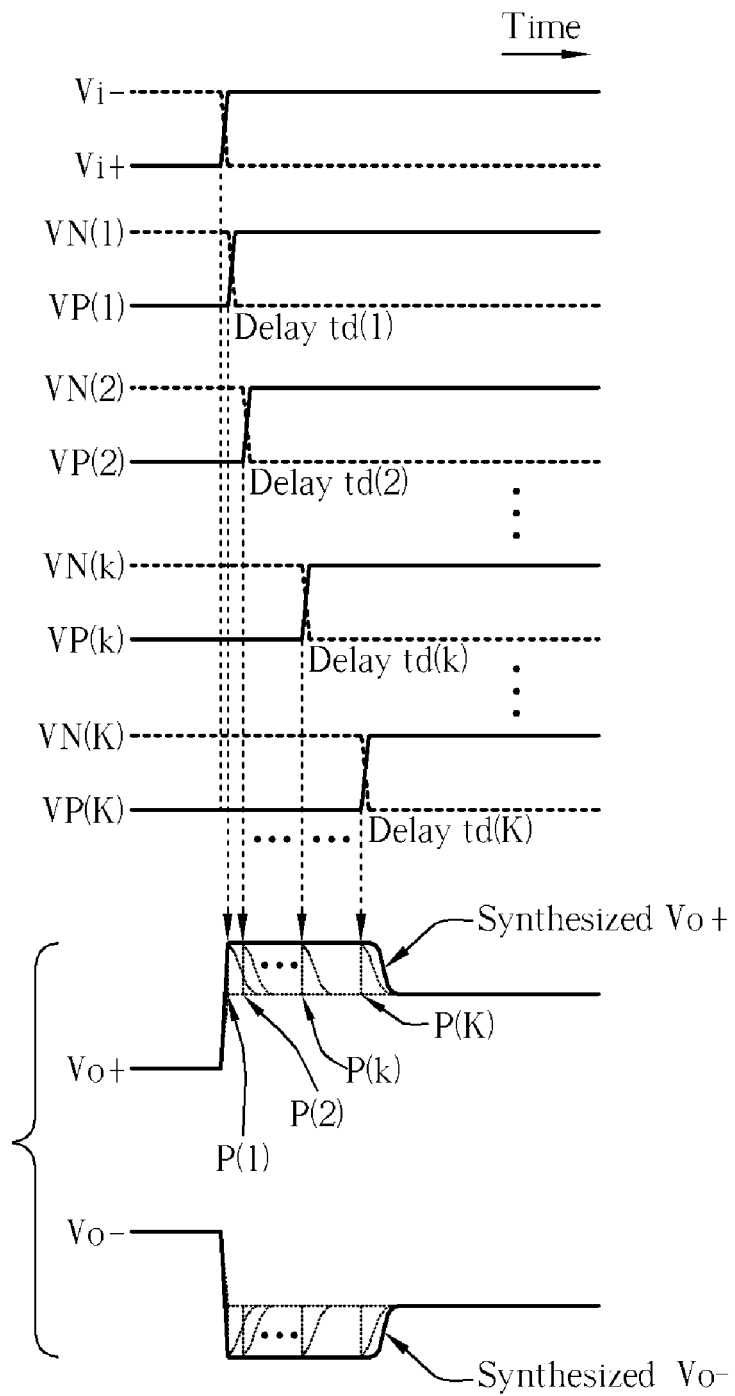
FIG. 10 shows the synthetic pre-emphasis waveforms by the transmitter in FIG. 9.

For the driving units M2/M3, since these two driving units output the output signal Vo− in the node Nn according to the input signal Vi+, the corresponding charge units Q2(k)/Q3(k) (k=1~K) are electrically connected to the node Nn at one side and controlled by the inverse auxiliary signal VN at another side. In the same way, for the driving units M1/M4, since these two driving units output the output signal Vo+ at the node Np according to the input signal Vi−, the corresponding charge units Q1(k)/Q4(k) (k=1~K) are electrically connected to the node Np at one side and controlled by the inverse auxiliary signal VP at another side. When the level transition occurs in the auxiliary signals received by a charge unit, the charge unit can trigger a same trend peak wave in the corresponding output node. Therefore, different delay peak waves can be triggered by using different delay auxiliary signals in each output node, and the pre-emphasis peak wave with longer time can be synthesized in each output node. Please refer to FIG. 10. FIG. 10 shows the synthetic pre-emphasis waveforms by the transmitter 40 in FIG. 9.

As shown in FIG. 10, assuming that the relation of the delay time is 0<=td(1)<td(2)< . . . <td(k)< . . . <td(K) in the auxiliary circuit 46 in FIG. 9, when the input signal Vi+ changes from low to high and the input signal Vi− changes from high to low, the auxiliary signal VP(1) delays the rising-edge of the time td(1) and forms the peak wave P(1) in the output signal Vo+, and auxiliary signal VP(2) delays the rising-edge of the time td(2) and forms the peak wave P(2) later, and by analogy, the auxiliary signal VP(k) delays the rising-edge of the time td(k) and forms the peak wave P(k). Finally, the auxiliary signal VP(K) delays the rising-edge of the time td(K) and forms the peak wave P(K) in the output signal Vo+. Synthesizing the peak waves P(1) to P(K) triggered by the auxiliary signals VP(1) to VP(K) in the output signal Vo+, a pre-emphasis peak wave is formed in the rising-edge of the output signal Vo+. In the same way, the auxiliary signals VN(1) to VN(K) also can synthesize a pre-emphasis peak wave in the output signal Vo−. The present invention can synthesize different pre-emphasis peak waves for different signal transmission environments by adjusting the charge unit number, the equivalent capacitor of each charge unit, and the delay time td(1) to td(K).

Figure 11:
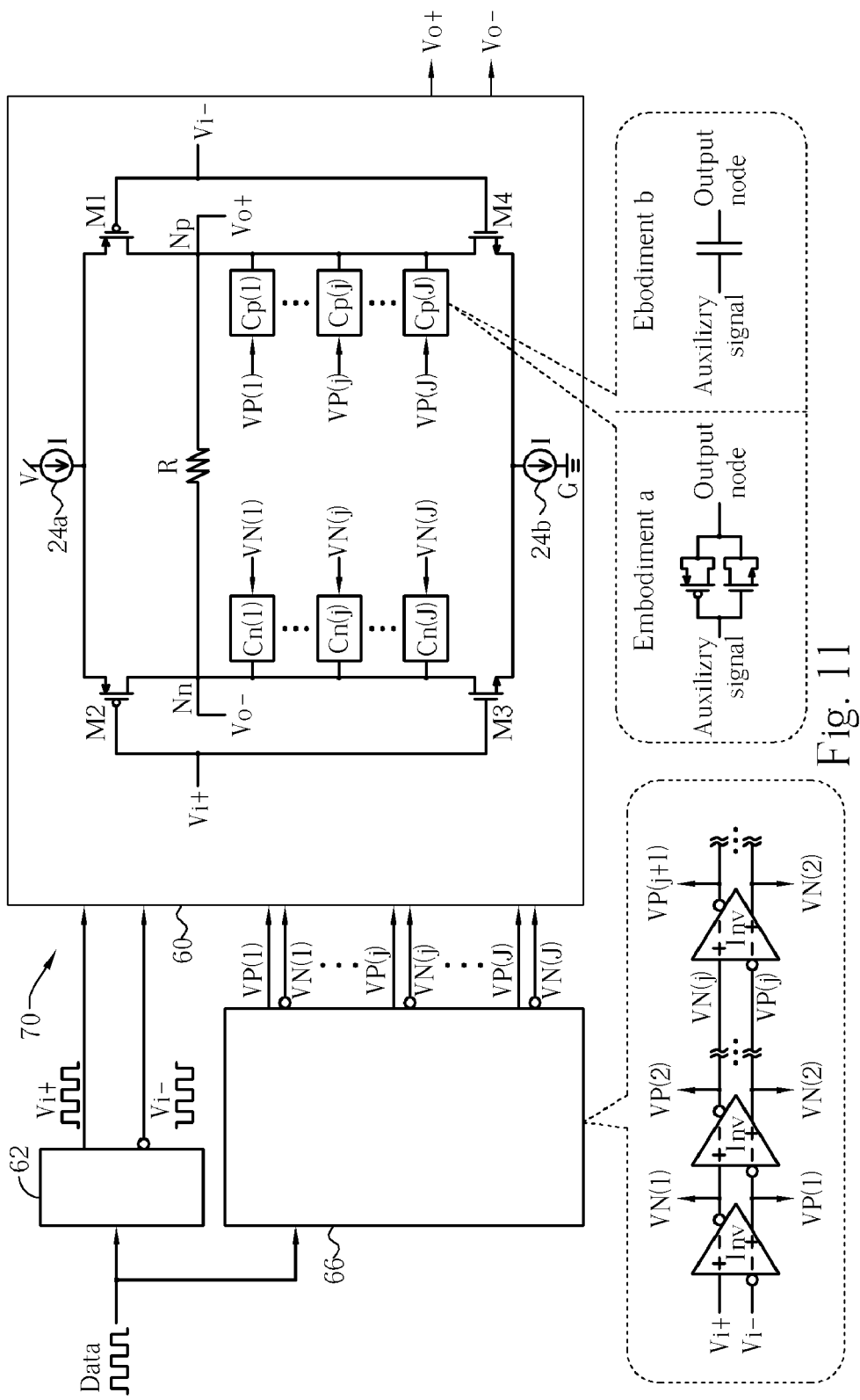
FIG. 11 shows another embodiment of the transmission circuit of the present invention.

Please refer to FIG. 11. FIG. 11 shows another embodiment of the transmission circuit of the present invention. The transmission circuit 70 includes a transmitter 60 and an auxiliary circuit 66. The transformation circuit 62 can transform the ready-for-transmission signals to the differential input signals Vi+, Vi−. The input signals Vi+, Vi− are input to the transmitter 60, and the transmitter 60 can output the output signals Vo+, Vo− accordingly. Similar with the transmitters in FIG. 6 and FIG. 9, the transmitter 60 is also biased between the D.C. voltages V and G, and the transmitter 60 is also equipped with D.C. current supplies 24a and 24b providing a load current I. Four transistors M1 to M4 are positioned as the driving unit to conduct the different direction load current I to the resistor R according to the level of the input signals Vi+, Vi−, and output the corresponding output signals Vo−, Vo+ at the output nodes Nn and Np.

In addition, the transmitter 60 includes the charge units Cn(1) to Cn(J) and Cp(1) to Cp(J), and the auxiliary circuit 66 provides the auxiliary signals VN(1) to VN(J) and VP(1) to VP(J) to the charge units. The auxiliary signals VP(j) and VN(j) are inverse to each other. For a given j, the auxiliary signal VP(j) can be the delay subsequence of the input signal Vi+, and the auxiliary signal VN(j) can be the delay subsequence of the input signal Vi−. Different auxiliary signals VP(j)/VN(j) and VP(j')/VN(j') have different delay times, i.e., different auxiliary signals VP(j)/VN(j) and VP(j')/VN(j') can have different phases. On the other hand, the charge units Cn(j) and Cp(j) can match each other. Each charge unit Cn(j)/Cp(j) receives the auxiliary signal VN(j)/VP(j)(j=1~J) at one side and electrically connects to the node Nn/Np at another side to inject the charges to the corresponding nodes according to the corresponding auxiliary signals and couple the level transition trend of the corresponding auxiliary signals to the corresponding nodes. Thus, the techniques of the present invention mentioned in FIGS. 7, 8, and 10 are realized.

As shown in embodiment a in FIG. 11, the charge units Cn(j)/Cp(j) can include a capacitor form PMOS transistor and a capacitor form NMOS transistor. As shown in embodiment b in FIG. 11, the charge units Cn(j)/Cp(j) can include only a capacitor, and the capacitor can be a capacitor form MOS transistor or a capacitor formed by metal layer on the oxidization layer. One side of the capacitor is electrically connected to the corresponding output node, and another side receives the corresponding auxiliary signal. In addition, different types of charge units can be combined in the transmitter 60. For example, using embodiment a for the charge units Cp(1)/Cn(1), the corresponding auxiliary signals VP(1)/VN(1) are synchronous with the input signals Vi+/Vi− to compensate for the non-ideal factors of the corresponding driving units. Using embodiment b for the other charge units Cp(2)/Cn(2) to Cp(J)/Cn(J), different delay time auxiliary signals synthesize a pre-emphasis waveform in the output signals Vo+ and Vo−.

Furthermore, an embodiment of the auxiliary circuit 66 is also shown in FIG. 11. The auxiliary circuit 66 uses a plurality of series differential inverters Inv to provide auxiliary signals VP(j)/VN(j) with different delay times.

In summary, the present invention uses charge units of a transmitter to provide an equivalent capacitor, and uses the capacitor effect of the equivalent capacitor to provide a proper level transition trend and charges to the corresponding node. Compared with the prior art, the present invention not only properly compensates for charge injection and clock feedthrough in the transmitter, but also realizes pre-emphasis in a single transmitter and improves signal transmission quality of the system with lower power consumption and simpler circuit layout. The present invention can be widely used in bus protocols, e.g., USB (universal serial bus), IEEE 1394, and SATA (serial ATA), to realize the transmitters and circuits needed in such protocols. Besides, the present invention can also be used in the transmitter or output circuit with a single input/output side.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmission circuit for receiving an input signal and providing a corresponding output signal at a corresponding output node, the transmission circuit comprising:
    an auxiliary circuit, providing at least an auxiliary signal according to the input signal; and
    a transmitter comprising:
        at least a driving unit, each driving unit individually providing a load current to the output node according to a level of the input signal; and
        at least the charge unit, wherein each charge unit is electrically connected to the output node and each charge unit is individually corresponding to one of the auxiliary signals;
    wherein each driving unit in the transmitter is a metal-oxide semiconductor (MOS) transistor, and the transmitter provides a charge unit for each driving unit accordingly; each charge unit comprises a capacitor form MOS transistor, and the capacitor form MOS transistor and the MOS transistor of the corresponding driving unit are of a same type,
    wherein when a level transition occurs in the auxiliary signal, the charge unit is able to inject different charges to the output node according to a level transition trend and the level of the auxiliary signal is coupled to the output node,
    wherein the transmitter is able to receive a first input signal and a second input signal that are differential and individually provide two corresponding output signals to first and second output nodes accordingly, the auxiliary circuit provides at least a first auxiliary signal and a second auxiliary signal, and the auxiliary circuit provides the first auxiliary signal according to the second input signal and provides the second auxiliary signal according to the first input signal.

2. The transmission circuit of claim 1, wherein when a level transition of high level to low level occurs in the auxiliary signal, the charge unit is able to absorb positive charges and inject negative charges to the output node; when a level transition of low level to high level occurs in the auxiliary signal, the charge unit is able to absorb negative charges and inject positive charges to the output node.

3. The transmission circuit of claim 1, wherein the auxiliary circuit provides the auxiliary signal according to an inverse of the input signal.

4. The transmission circuit of claim 1, wherein the auxiliary circuit provides the auxiliary signal according to an inverse and a delay subsequence of the input signal.

5. The transmission circuit of claim 1, wherein the transmitter further comprises a plurality of charge units, and each charge unit corresponds to a same auxiliary signal.

6. The transmission circuit of claim 1, wherein the auxiliary circuit provides the auxiliary signal according to an inverse of the input signal and a subsequence of the different time delay, the transmitter further comprises plurality of charge units, and different charge units correspond to different auxiliary signals.

7. The transmission circuit of claim 1, wherein the MOS transistor in each charge unit matches the MOS transistor in the corresponding driving unit.

8. The transmission circuit of claim 1, wherein the surface size of the MOS transistor in each charge unit is bigger than that of the MOS transistor in the corresponding driving unit.

9. The transmission circuit of claim 1, wherein the transmitter further comprises a first driving unit and a fourth driving unit that are complementary to each other, and when an input signal level is high, the first driving unit provides the load current to the output node and the fourth driving unit stops providing the load current; when the input signal level is low, the first driving unit stops providing current and the fourth driving unit provides an inverse load current an the output node.

10. The transmission circuit of claim 1, wherein the transmitter comprises at least a first driving unit and a second driving unit, and at least a first charge unit and a second charge unit; each first driving unit and second driving unit individually provides the load current to the first and the second output nodes according to the first and the second input signals; each first and second charge unit is electrically connected to the first and the second output nodes to inject different charges in the first and the second output nodes according to the level transition trend and couple the level of the first and second auxiliary signals to the first and second output nodes.

11. A transmission circuit for receiving an input signal and providing a corresponding output signal at a corresponding output node, the transmission circuit comprising:
an auxiliary circuit, providing at least an auxiliary signal according to the input signal; and
a transmitter comprising:
at least a driving unit, each driving unit individually providing a load current to the output node according to a level of the input signal; and
at least a charge unit, wherein each charge unit is electrically connected to the output node and each charge unit is individually corresponding to one of the auxiliary signals;
wherein each driving unit in the transmitter is a metal-oxide semiconductor (MOS) transistor, and the transmitter provides the charge unit for each driving unit accordingly; each charge unit comprises a capacitor form MOS transistor, and the capacitor form MOS transistor and the MOS transistor of the corresponding driving unit are of a same type,
wherein when a level transition occurs in the auxiliary signal, the charge unit is able to inject different charges to the output node according to a level transition trend and the level of the auxiliary signal is coupled to the output node,
wherein the transmitter is able to receive a first input signal and a second input signal that are differential and individually provide two corresponding output signals to first and second output nodes accordingly, the auxiliary circuit provides at least a first auxiliary signal and a second auxiliary signal, and the auxiliary circuit provides the first auxiliary signal according to a second input signal delay subsequence, and provides the second auxiliary signal according to a first input signal delay subsequence.

12. The transmission circuit of claim 11, wherein when a level transition of high level to low level occurs in the auxiliary signal, the charge unit is able to absorb positive charges and inject negative charges to the output node; when a level transition of low level to high level occurs in the auxiliary signal, the charge unit is able to absorb negative charges and inject positive charges to the output node.

13. The transmission circuit of claim 11, wherein the auxiliary circuit provides the auxiliary signal according to an inverse of the input signal.

14. The transmission circuit of claim 11, wherein the auxiliary circuit provides the auxiliary signal according to an inverse and a delay subsequence of the input signal.

15. The transmission circuit of claim 11, wherein the transmitter further comprises a plurality of charge units, and each charge unit corresponds to a same auxiliary signal.

16. The transmission circuit of claim 11, wherein the auxiliary circuit provides the auxiliary signal according to an inverse of the input signal and a subsequence of the different time delay, the transmitter further comprises plurality of charge units, and different charge units correspond to different auxiliary signals.

17. The transmission circuit of claim 11, wherein the MOS transistor in each charge unit matches the MOS transistor in the corresponding driving unit.

18. The transmission circuit of claim 11, wherein the surface size of the MOS transistor in each charge unit is bigger than that of the MOS transistor in the corresponding driving unit.

19. The transmission circuit of claim 11, wherein the transmitter further comprises a first driving unit and a fourth driving unit that are complementary to each other, and when an input signal level is high, the first driving unit provides the load current to the output node and the fourth driving unit stops providing the load current; when the input signal level is low, the first driving unit stops providing current and the fourth driving unit provides an inverse load current an the output node.

20. The transmission circuit of claim 11, wherein the transmitter comprises at least a first driving unit and a second driving unit, and at least a first charge unit and a second charge unit; each first driving unit and second driving unit individually provides the load current to the first and the second output nodes according to the first and the second input signals; each first and second charge unit is electrically connected to the first and the second output nodes to inject different charges in the first and the second output nodes according to the level transition trend and couple the level of the first and second auxiliary signals to the first and second output nodes.

* * * * *